United States Patent
Matsuda et al.

(10) Patent No.: US 10,378,097 B2
(45) Date of Patent: *Aug. 13, 2019

(54) FILM FORMING APPARATUS

(71) Applicant: TOYOTA JIDOSHA KABUSHIKI KAISHA, Toyota-shi (JP)

(72) Inventors: Shota Matsuda, Toyota (JP); Hiromichi Nakata, Toyota (JP); Takayasu Sato, Takahama (JP); Yoji Sato, Nagoya (JP); Kazutaka Tachibana, Nagoya (JP); Daiki Tsuboi, Aichi-ken (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 48 days.

This patent is subject to a terminal disclaimer.

(21) Appl. No.: 15/653,698

(22) Filed: Jul. 19, 2017

(65) Prior Publication Data
US 2018/0044777 A1    Feb. 15, 2018

(30) Foreign Application Priority Data
Aug. 10, 2016   (JP) .................................. 2016-158011

(51) Int. Cl.
*C23C 14/34* (2006.01)
*C23C 16/455* (2006.01)
(Continued)

(52) U.S. Cl.
CPC ...... *C23C 14/325* (2013.01); *C23C 16/45523* (2013.01); *C23C 16/515* (2013.01);
(Continued)

(58) Field of Classification Search
CPC ............ C23C 14/325; C23C 16/45523; C23C 16/515; H01J 37/32055; H01J 37/32403; H01J 37/32568; H01J 37/32614
(Continued)

(56) References Cited

U.S. PATENT DOCUMENTS

| 5,269,896 A | 12/1993 | Munemasa et al. |
| 6,187,160 B1 | 2/2001 | Rick et al. |

(Continued)

FOREIGN PATENT DOCUMENTS

| DE | 100 18 143 A1 | 10/2001 |
| DE | 10 2015 111 102 A1 | 1/2016 |

(Continued)

OTHER PUBLICATIONS

Japanese Decision to Grant a Patent issued in Japanese Patent Application No. 2016-158011 dated Jun. 25, 2018, (w/ English Translation).

(Continued)

*Primary Examiner* — Rodney G McDonald
(74) *Attorney, Agent, or Firm* — Oblon, McClelland, Maier & Neustadt, L.L.P.

(57) ABSTRACT

A film forming apparatus includes a cylindrical evaporation source, an electrode, and a gas passage. The evaporation source is composed of metal and includes an internal space for accommodating a workplace. The electrode is arranged in the internal space of the evaporation source, The gas passage supplies gas to the internal space of the evaporation source from a space outside the evaporation source. The gas passage includes an end portion located in the internal space. The end portion of the gas passage includes a first section composed of a first material and a second section composed of a second material. The first material and the second material have different thermal expansion coefficients.

5 Claims, 3 Drawing Sheets

(51) Int. Cl.
*C23C 14/32* (2006.01)
*C23C 16/515* (2006.01)
*C30B 25/10* (2006.01)
*H01J 37/32* (2006.01)
*C30B 23/06* (2006.01)

(52) U.S. Cl.
CPC .......... *C30B 23/066* (2013.01); *C30B 25/105* (2013.01); *H01J 37/32055* (2013.01); *H01J 37/32403* (2013.01); *H01J 37/32568* (2013.01); *H01J 37/32614* (2013.01)

(58) Field of Classification Search
USPC ............ 204/192.38, 298.41, 298.21, 298.22, 204/298.07
See application file for complete search history.

(56) References Cited

U.S. PATENT DOCUMENTS

| | | | |
|---|---|---|---|
| 6,916,399 | B1 | 7/2005 | Rozenzon et al. |
| 2002/0047540 | A1 | 4/2002 | Fujita et al. |
| 2004/0038033 | A1 | 2/2004 | Massler et al. |
| 2008/0006523 | A1 | 1/2008 | Hosokawa et al. |
| 2008/0017113 | A1* | 1/2008 | Goto .................. C23C 16/045 118/723 R |
| 2011/0067631 | A1 | 3/2011 | Tamagaki et al. |
| 2012/0080309 | A1 | 4/2012 | Bender et al. |
| 2013/0142991 | A1 | 6/2013 | Cao et al. |
| 2014/0042022 | A1 | 2/2014 | Xu et al. |
| 2016/0013027 | A1 | 1/2016 | Sato et al. |

FOREIGN PATENT DOCUMENTS

| | | |
|---|---|---|
| JP | 04-354863 | 12/1992 |
| JP | 11-100665 | 4/1999 |
| JP | 2001-355064 A | 12/2001 |
| JP | 2007-138286 A | 6/2007 |
| JP | 2009-228076 A | 10/2009 |
| JP | 2013-036106 A | 2/2013 |
| JP | 2013-509004 A | 3/2013 |
| JP | 2015-040313 A | 3/2015 |
| JP | 2016-020518 | 2/2016 |
| WO | 2011/056515 A2 | 5/2011 |

OTHER PUBLICATIONS

U.S. Office Action issued in U.S. Appl. No. 14/793,041 dated Apr. 18, 2017.

U.S. Office Action issued in U.S. Appl. No. 14/793,041 dated Sep. 15, 2017.

U.S. Advisory Action issued in U.S. Appl. No. 14/793,041 dated Jan. 9, 2018.

* cited by examiner

FILM FORMING APPARATUS

BACKGROUND OF THE INVENTION

The present invention relates to a film forming apparatus for forming a film on a workpiece by using arc discharge.

The film forming apparatus disclosed in Japanese Laid-open Patent Publication No. 2016-20518 is a device that forms a film by depositing, on the surface of a workpiece, metal ions that have been released from an evaporation source by arc discharge. This film forming apparatus has a cylindrical evaporation source having an internal space for accommodating a workplace, a closing member for sealing the internal space, and an electrode provided along the inner wall surface of the evaporation source.

In such a film forming apparatus, the external power supply applies a discharge voltage to the evaporation source. The bias supply applies a bias voltage to the workpiece accommodated in the internal space of the evaporation source. The closing member is grounded. Then, the striker is brought into contact with the evaporation source and separated from the evaporation source immediately thereafter, so that arc discharge is generated in which the evaporation source serves as a cathode and the closing member serves as an anode. As a result, a high-density current is concentrated on the arc spot on the inner wall surface of the evaporation source, and ions are released. In the film forming apparatus described in the above publication, the electrode is either grounded or supplied with a positive voltage lower than the voltage of the evaporation source so as to function as an anode like the closing member.

In the case of the film forming apparatus described in the above publication, the electrode has a gas passage for supplying process gas to the internal space of the evaporation source. The metal ions released from the evaporation source are deposited not only on the workpiece but also on the electrode in some cases. In this case, if arc discharge is repeatedly generated and the deposition amount of metal ions on the electrode is increased, a metal film may be formed so as to block the opening of the gas passage in the electrode. Since the film forming apparatus of the above publication does not take these factors into consideration, there is still room for improvement.

SUMMARY OF THE INVENTION

To achieve the foregoing objective and in accordance with one aspect of the present invention, a film forming apparatus is provided that includes a cylindrical evaporation source that is composed of metal and includes an internal apace for accommodating a workpiece, an electrode arranged in the internal space of the evaporation source, and a gas passage that supplies gas to the internal space of the evaporation source from a space outside the evaporation source and includes an end portion located in the internal space. The film forming apparatus is configured to form a film by depositing, on the workpiece, metal ions are released from the evaporation source by arc discharge generated between the evaporation source and the electrode. The end portion of the gas passage includes a first section composed of a first material and a second section composed of. a second material. The first material and the second material have different thermal expansion coefficients.

In the above-described configuration, the end portion of the gas passage includes the first section and the second section, which are composed of materials having different thermal expansion coefficients. When the gas passage expands due to the heat of the arc discharge, a difference occurs in the degree of thermal expansion between the first section and the second section. That is, the end portion of the gas passage is repeatedly thermally expanded by the heat of the arc discharge generated at the film formation so as to change the distance between the first section and the second section. Therefore, with the above-described configuration, even if metal ions are deposited on the end portion of the gas passage so that a metal film is formed to block the end portion of the gas passage, the shedding of the metal film is promoted.

The above-described film forming apparatus preferably includes an adhesion-preventing member that is arranged between the evaporation source and the electrode and is electrically insulated from the evaporation source and the electrode. The electrode includes the first section. The adhesion-preventing member includes the second section. The end portion of the gas passage is constituted by the electrode and the adhesion-preventing member.

With the above-described configuration, it is unnecessary to provide a member that constitutes the end portion of the gas passage separately from the electrode and the adhesion-preventing member. This contributes to reduction in the number of components of the film forming apparatus.

In the film forming apparatus, the first material, of which the electrode is composed, preferably has a higher thermal conduction coefficient than that of the second material, of which the adhesion-preventing member is composed.

In the above-described configuration, the thermal conduction coefficient of the electrode is higher than the thermal conduction coefficient of the adhesion-preventing member. Therefore, the heat of the electrode is more likely to be transmitted to members other than the adhesion-preventing member. In this way, since the heat of the electrode is more likely to escape to other members, the temperature of the electrode is prevented from remaining excessively high.

In the film forming apparatus, the first material, of which the electrode is preferably composed, has a lower thermal expansion coefficient than that of the second material, of which, the adhesion-preventing member is composed.

In the above-described configuration, the adhesion-preventing member has a greater degree of thermal expansion than the electrode. Also, as described above, the adhesion-preventing member is less likely to lose heat as compared with the electrode. Thus, the high-temperature state of the adhesion-preventing member lasts longer than that of the electrode. Therefore, the above-described configuration increases the dimensional difference due to thermal expansion between the adhesion-preventing member and the electrode, thereby increasing the change in the distance between the adhesion-preventing member and the electrode before and after the thermal expansion.

Other aspects and advantages of the present invention will become apparent from the following description, taken, in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A film forming apparatus according to one embodiment will now be described with reference to FIGS. 1 to 4B.

Figure 1:
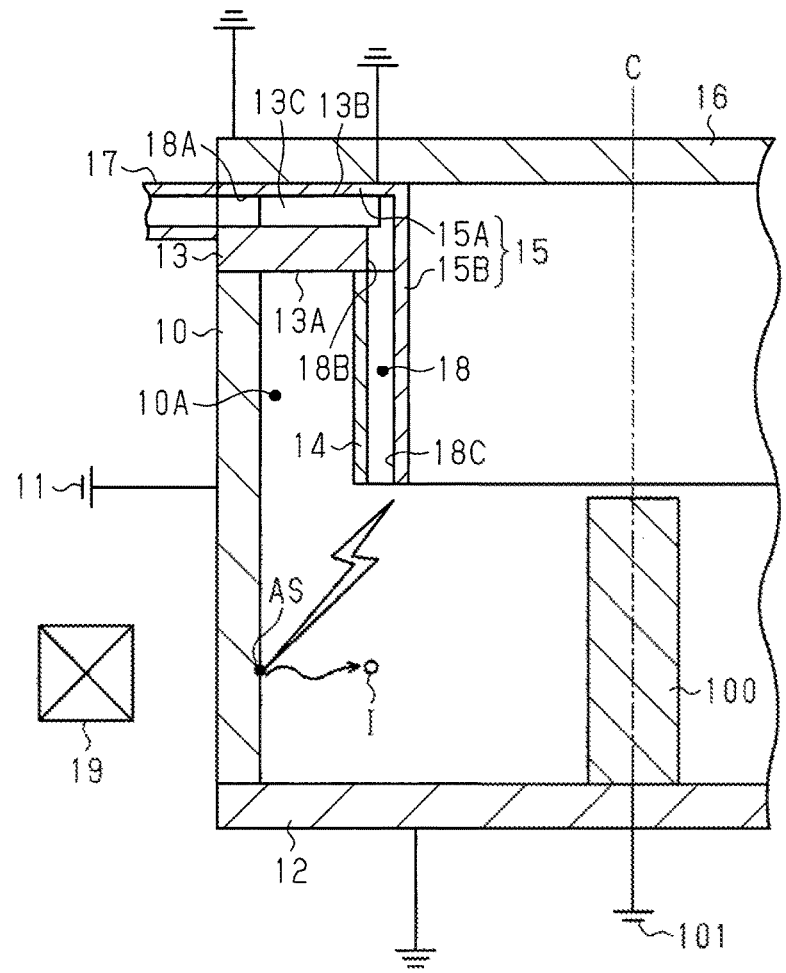
FIG. 1 is a cross-sectional view schematically showing the configuration of a film forming apparatus according to one embodiment.
Figure 2:
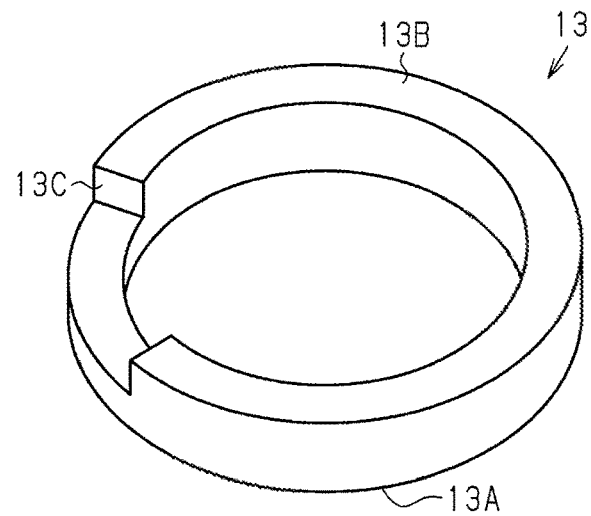
FIG. 2 is a perspective view showing the configuration of the coupling member.

As shown in FIG. 1, the film forming apparatus has an evaporation source 10. The evaporation source 10 is composed of metal such as titanium, for example. The evaporation source 10 has a cylindrical shape with an internal space 10A inside. The evaporation source 10 is electrically connected to an external power supply 11. The evaporation source 10 has a first end (the lower end as viewed in FIG. 1) in a direction in which a central axis C extends. A first sealing member 12 is connected to the first end. The first sealing member 12 is shaped as a disk. The diameter of the first sealing member 12 is equal to the outer diameter of the evaporation source 10. The first sealing member 12 and the evaporation source 10 are coupled to each other with insulating sealing material (not shown) in between. The first sealing member 12 is grounded. A coupling member 13 is coupled to the second end (the upper end as viewed in FIG. 1) of the evaporation source 10 in the axial direction.

As shown in FOG. 2, the coupling member 13 has an annular shape. The coupling member 15 has a first end face 13A (the lower end face as viewed in FIG. 2), to which the upper end of the evaporation source 10 is coupled. The coupling member 13 has a second end face 13B (the upper end face as viewed in FIG. 2), which is on the side opposite to the first end face 13A, and an introduction groove 13C, which has a shape provided by cutting out the second end face 13B. In the coupling member 13, the wall thickness of the portion where the introduction groove 13C is formed, that is, the length of the coupling member 13 in the axial direction is smaller than the wall thickness of the remaining portion. The outer diameter of the coupling member 13 is equal to the outer diameter of the evaporation source 10. The inner diameter of the coupling member 13 is smaller than the inner diameter of the evaporation source 10. The coupling member 13 is arranged coaxially with the evaporation source 10. Thus, as shown in FIG. 1, the portion on the inner circumferential portion of the coupling member 13 is positioned closer to the central axis C than the evaporation source 10 in the radial direction (the left-right direction as viewed in FIG. 1). The coupling member 13 is manufactured by molding a conductive material and then covering the entire surface with an insulating material such as alumina. Therefore, the coupling member 13 has insulating properties.

A cylindrical adhesion-preventing member 14 is coupled to the first end face 13A of the coupling member 13. The adhesion-preventing member 14 is composed of stainless steel and extends from the coupling member 13 toward the first sealing member 12. The outer diameter of the adhesion preventing member 14 is smaller than the inner diameter of the evaporation source 10. The inner diameter of the adhesion-preventing member 14 is equal to the inner diameter of the coupling member 13. The adhesion-preventing member 14 is arranged coaxially with the evaporation source 10. Thus, the outer wall surface of the adhesion-preventing member 14 and the inner wall surface of the evaporation source 10 are opposed to each other while being spaced apart from each other over the entire circumference. Also, the inner wall surface of the adhesion-preventing member 14 and the inner wall surface of the coupling member 13 are flush with each other.

The film forming apparatus also includes an electrode 15, The electrode 15 is composed of aluminum and is grounded. The electrode 15 includes an annular contact plate portion 15A, which is in contact with the second end face 13B of the coupling member 13, and a cylindrical discharge portion 15B, which is bent from part on the inner circumference of the contact plate portion 15A and extends in the axial direction. The discharge portion 15B. extends from the contact plate portion 15A toward the first sealing member 12. The outer diameter of the discharge portion 15B is smaller than the inner diameter of the adhesion-preventing member 14. The discharge portion 15B is arranged coaxially with the adhesion-preventing member 14. Thus, the adhesion-preventing member 14 is arranged between the evaporation source 10 and the electrode 15. The outer wall surface of the discharge portion 15B is opposed to and separated from the inner wall surfaces of the adhesion-preventing member 14 and the coupling member 13. In the axial direction, the distal end of the discharge portion 15B is at the same position: as the distal end of the adhesion-preventing member 14. Since the discharge portion 15B is arranged coaxially with the evaporation source 10, the distance in the radial direction from the outer wall surface of the discharge portion 15B to the inner wall surface of the evaporation source 10 is uniform over the entire circumference, Further, a second sealing member 16 is coupled to the contact plate portion 15A of the electrode 15. That is, the contact plate portion 15A is sandwiched between the second sealing member 16 and the coupling member 13. The second sealing member 16 is shaped as a disk. The diameter of the second sealing member 16 is equal to the outer diameter of the evaporation source 10. The second sealing member 16 and the electrode 15 are coupled to each other with insulating sealing material (not shown) in between. The second sealing member 16 is grounded. The internal space 10A of the evaporation source 10 is hermetically sealed by the first sealing member 12 and the second sealing member 16.

As shown in FIG. 1, the film forming apparatus also includes an introduction pipe 17, through which process gas flows. As the process gas, a gas suitable for arc discharge such as acetylene gas or argon gas can be employed. The introduction pipe 17 is coupled to the outer circumferential surface of the electrode 15 and the outer circumferential surface of the coupling member 13, and communicates with the introduction groove 13C. Thus, the process gas flowing through the introduction pipe 17 flows into the space between the adhesion-preventing member 14 and the electrode 15 through the introduction groove 13C and is supplied, to the internal space 10A of the evaporation source 10. That is, the coupling member 13, the adhesion-preventing member 14, and the electrode 15 constitute a gas passage 18 for supplying the process gas from the space outside the evaporation source 10 to the internal space 10A of the evaporation source 10. The gas passage 18 includes an introduction passage 18A and a communication passage 18B. The introduction passage 18A is constituted by the introduction groove 13C of the coupling member 13 and the contact plate portion ISA of the electrode 15. The communication passage 18B is constituted by the inner wall surface of the coupling member 13 and the outer wall surface of the discharge portion 15B of the electrode 15. Further, the gas passage 18 also includes an outlet passage 18C, which is constituted by the adhesion-preventing member 14 and the electrode 15. The outlet passage 18C is an end portion of the gas passage 18 that is arranged in the internal space IDA of the evaporation source 10.

Aluminum, of which the electrode 15 is composed, has a higher thermal expansion coefficient than stainless steel, of which the adhesion-preventing member 14 is composed. Therefore, the outlet passage 18C in the gas passage 18 is composed of materials having different thermal expansion coefficients. That is, in the present embodiment, aluminum, of which the electrode 15 is composed, corresponds to a first material, and stainless steel, of which the adhesion-preventing member 14 is composed, corresponds to a second material, in the outlet passage 18C of the gas passage 18, the radially inner section, which is constituted by the electrode 15, corresponds to a first section, and the radially outer section, which is constituted by the adhesion-preventing member 14, corresponds to a second section. Aluminum, of which the electrode 15 is composed, has a higher thermal conduction coefficient, than stainless steel, of which the adhesion-preventing member 14 is composed.

The film forming apparatus also includes an electromagnetic coil 19, which is arranged to surround the outer circumference of the evaporation source 10 and generates a magnetic field when energized.

In this film forming apparatus, a workpiece 100 is housed in the internal space IDA of the evaporation source 10, and the internal space 10A is hermetically sealed by the first sealing member 12 and the second sealing member 16. While supplying process gas through the gas passage 18, a discharge voltage is applied from the external power supply 11 to the evaporation source 10, and a bias voltage is applied to the workpiece 100 by a bias supply 101. The workpiece 100 and the first sealing member 12 are insulated from each other by an insulating member such as an insulating sheet (not shown). In this case, arc discharge is generated in which the evaporation source 10 serves as a cathode and the electrode 15 serves as an anode.

The adhesion-preventing member 14, which is located between the evaporation source 10 and the electrode 15, is connected to the coupling member 13, which has insulating properties, and is electrically insulated from the evaporation source 10 and the electrode 15. Thus, as shown in FIG. 1, the generation of glow discharge is restrained at the portion where the adhesion-preventing member 14 is arranged, and arc discharge is generated between the distal end of the discharge portion 15B of the electrode 15 and the evaporation source 10, while avoiding the adhesion-preventing member 14. When arc discharge is generated between the evaporation source 10 and the electrode 15, a high-density current concentrates on an arc spot AS on the inner wall surface of the evaporation source 10, and metal ions I are released. Then, the metal ions I are deposited on the workplace 100, to which a bias voltage is applied, thereby forming a film. The current flowing through the electromagnetic coil 19 is changed to shift the position at which the arc discharge is generated in the film forming apparatus in the circumferential direction, thereby preventing repeated generation of arc discharge at a specific position.

Operational advantages of the present embodiment will now be described with reference to FIGS. 3, 4A, and 4B, (1) The metal ions I released from the evaporation source 10 due to the arc discharge are deposited not only on the workpiece 100, but also on members such, as the adhesion-preventing member 14, the electrode 15, the sealing members 12, 16, and the like.

Figure 3:
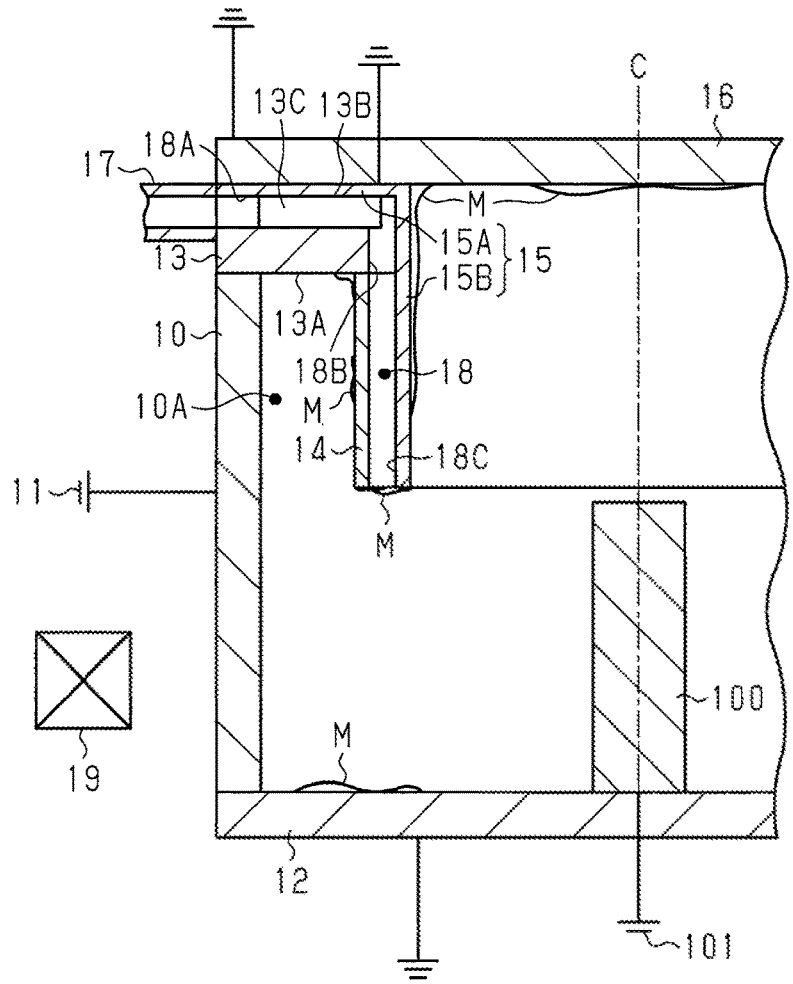
FIG. 3 is a cross-sectional view schematically showing a manner in which a metal film is formed when arc discharge is repeatedly generated in the film forming apparatus.

As shown in FIG. 3, when arc discharge is repeatedly generated and the deposition amount of the metal ions I on the adhesion-preventing member 14 and the electrode 15 increases, a metal film M is formed so as to connect the adhesion-preventing; member 14 and the electrode is, and part of the outlet passage 18C of the gas passage 18 may be blocked by the metal film M.

Figure 4A:
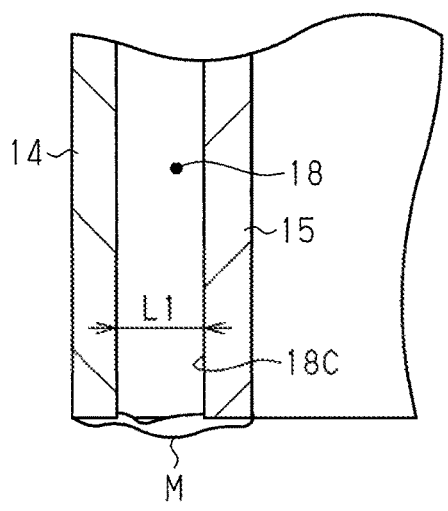
FIG. 4A is a cross-sectional view showing the distance between the electrode and the adhesion-preventing member before thermal expansion due to are discharge.
Figure 4B:
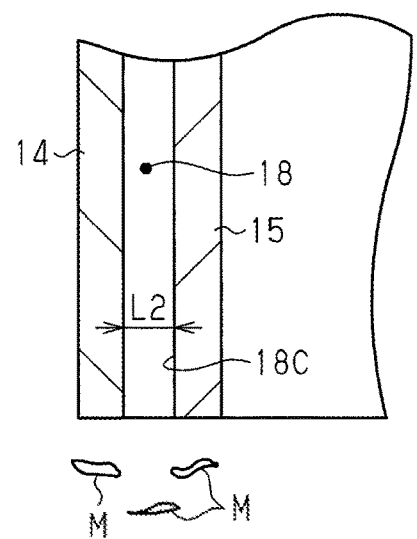
FIG. 4B is a cross-sectional view showing a change in the distance between the electrode and the adhesion-preventing member after thermal expansion due to arc discharge.

As shown in FIG. 4A, when arc discharge is generated in a state in which part of the outlet passage 18C of the gas passage 18 is blocked by the metal film M, the heat of the arc discharge is applied to and thermally expands the adhesion-preventing member 14 and the electrode 15. At this time, since the degree of thermal expansion differs between the adhesion-preventing member 14 and the electrode 15, the distance between the adhesion-preventing member 14 and the electrode 15 changes as shown in FIG. 4B. That is, since the electrode 15 is composed of a material having a thermal expansion coefficient higher than that of the adhesion-preventing member 14, the degree of radially outward expansion of the electrode 15 is greater than the degree of radially outward expansion of the adhesion-preventing member 14, so that the distance L2 between the electrode 15 and the adhesion-preventing member 14 after the thermal expansion is shorter than the distance L1 between the electrode 15 and the adhesion-preventing member 14 before the thermal expansion (L1>L2). On the other hand, when the generation of arc discharge is stopped, the temperatures of the electrode 15 and the adhesion-preventing member 14 drop. Accordingly, the distance between the electrode 15 and the adhesion-preventing member 14 returns to the earlier distance L1, which was present before the thermal expansion. In this manner, the outlet passage 18C of the gas passage 18 is repeatedly thermally expanded with the heat of the arc discharge generated during the film formation, so that the distance between the electrode 15 and the adhesion-preventing member 14 changes. As a result, compressive stress is repeatedly applied to the metal film M to prompt shedding of the metal film M as shown in FIG. 4B. Therefore, even if metal ions I are deposited on the adhesion-preventing member 14 and the electrode 15 to form the metal film M, which, in turn, blocks the outlet passage 18C of the gas passage 18, the metal film M is prevented from continuing to adhere.

(2) Since the outlet passage 18C of the gas passage 18 is constituted .by the adhesion-preventing member 14 and the electrode 15, it is not necessary to provide members constituting the outlet passage 18C of the gas passage 18 separately from the adhesion-preventing member 14 and the electrode 15. This contributes to reduction in the number of components of the film forming apparatus.

(3) When the adhesion-preventing member 14 and the electrode 15 are short-circuited by the metal film M, the adhesion-preventing member 14 and the evaporation source 10 can be electrically connected to each other, and arc discharge is generated in which the evaporation source 10 serves as a cathode and the adhesion-preventing member 14, which is located at a position closer to the evaporation source 10 than the electrode 15, serves as an anode. In such a case, it is difficult to change the position where arc discharge is generated by controlling the current to the electromagnetic coil 13, and arc discharge is repeatedly generated in the short-circuited portion. Therefore, heat concentrates at a specific position in the circumferential direction of the electrode 15.

In the present embodiment, the adhesion-preventing member 14 and the electrode 15, which constitute the gas passage 18, are composed of materials having different thermal expansion coefficients. Therefore, the distance between the adhesion-preventing member 14 and the electrode 15 is changed by using the heat of the arc discharge to remove the metal film M, which would cause a short circuit between the electrode 15 and the adhesion-preventing member 14. This, in turn, restrains concentration of heat at a specific position on the electrode 15.

(4) Aluminum, of which the electrode 15 is composed, has a higher thermal conduction coefficient than stainless steel, of which the adhesion-preventing member 14 is composed. Thus, the heat of the electrode 15 is easier to transmit to other members when the arc discharge is stopped than the heat of the adhesion-preventing member 14. In this way, since the heat of the electrode 15 is more likely to escape to other members, the temperature of the electrode 15 is prevented from remaining excessively high.

The above-illustrated embodiment may be modified as follows.

Copper may be employed as the first material, of which the electrode 15 is composed, and aluminum may be employed as the second material, of which the adhesion-preventing member 14 is composed. In this configuration, the material of which the electrode 15 is composed has a higher thermal conduction coefficient and a lower thermal expansion coefficient than the material of which the adhesion-preventing member 14 is composed. Thus, in addition to the advantages (1) to (4), the following advantage is achieved.

(5) In the present embodiment, the degree of thermal expansion of the adhesion-preventing member 14 is greater than that of the electrode 15. Therefore, when receiving the heat of arc discharge, the degree of radially outward expansion of the electrode 15 is smaller than the degree of radially outward expansion of the adhesion-preventing member 14, so that the distance between the electrode 15 and the adhesion-preventing member 14 after the thermal expansion is greater than the distance between the electrode 15 and the adhesion-preventing member 14 before the thermal expansion. This applies tensile stress on the metal film M, thereby promoting shedding of the metal film M. Also, the material of which the adhesion-preventing member 14 is composed has a lower thermal conduction coefficient than the material of which the electrode 15 is composed. Thus, the adhesion-preventing member 14 is less likely to lose heat as compared with the electrode 15. Thus, the high-temperature state of the adhesion-preventing member 14 lasts longer than that of the electrode 15. That is, in the process in which the temperature of the electrode 15 is lowered and the thermal expansion is subsided, the temperature of the adhesion-preventing member 14 and the thermal expansion of the adhesion-preventing member 14 can be maintained, thereby increasing the dimensional difference due to the thermal expansion between the adhesion-preventing member 14 and the electrode 15.

The first material, of which the electrode 15 is composed, and the second material, of which the adhesion-preventing member 14 is composed, are not limited to stainless steel of aluminum, and metals such as copper, nickel, tungsten, molybdenum and the like can be employed when appropriate. The first material and the second material may be selected such that the thermal expansion coefficient of the first material is higher than that of the second material, and that the thermal conductivity coefficient of the first material is lower than that of the second material. Alternatively, the first material and the second material may be selected such that the thermal expansion coefficient of the first material is lower than that of the second material, and that the thermal conductivity coefficient of the first material is lower than that of the second material. Furthermore, the first material and the second material may be selected such that the thermal conductivity coefficient of the first material is equal to that or the second material. The difference between the thermal expansion coefficient of the first material and that of the second material is preferably, for example, greater than or equal to the difference between the thermal expansion coefficient of SUS 304 and that of aluminum, and more preferably greater than or equal to the difference between the thermal expansion coefficient of SUS 403 and the thermal expansion coefficient of aluminum.

In the film forming apparatus, it is also possible to constitute a gas passage by using members other than the electrode 15 or the adhesion-preventing member 14. For example, the configuration shown in FIG. 5 may be employed. Like or the same reference numerals are given to those components that are like or the same as the corresponding components of the above-mentioned embodiments and detailed explanations are omitted.

Figure 5:
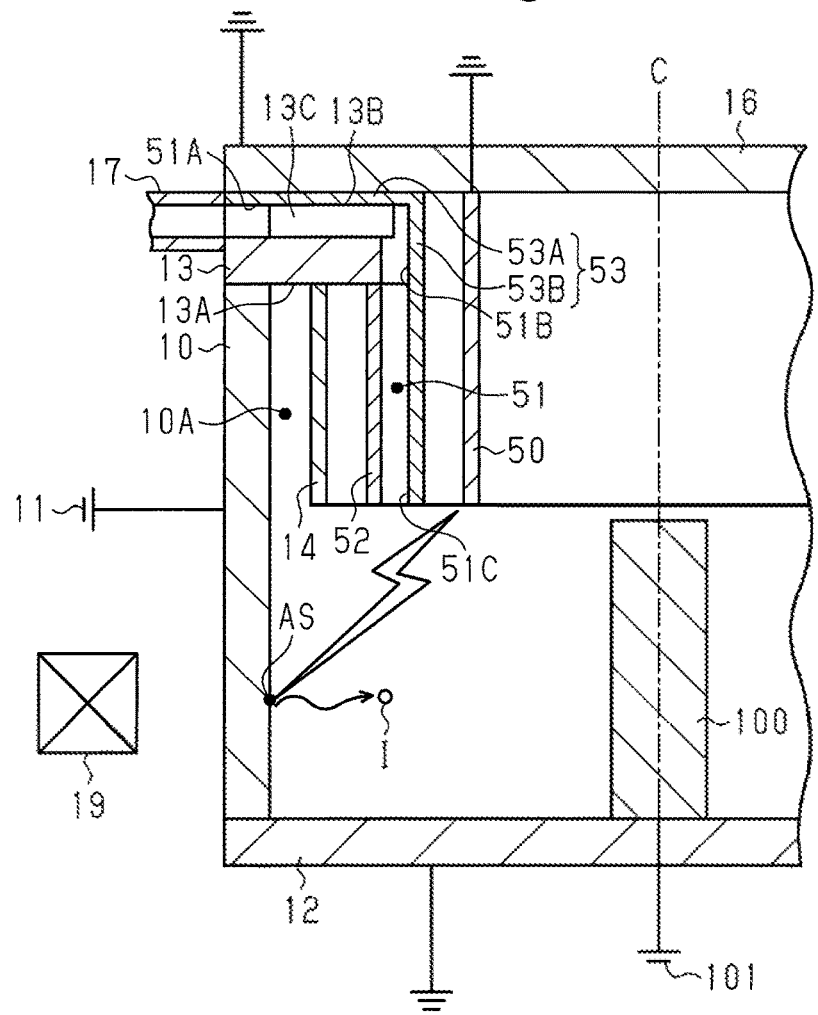
FIG. 5 is a cross-sectional view schematically showing the configuration of a film forming apparatus according to a modification.

As shown in FIG. 5, the film forming apparatus has an adhesion-preventing member 14 connected to a first end face 13A of a coupling member 13. The adhesion-preventing member 14 is a cylindrical member composed of stainless steel and extends from the coupling member 13 toward the first sealing member 12. The outer diameter of the adhesion-preventing member 14 is smaller than the inner diameter of the evaporation source 10. The inner diameter of the adhesion-preventing member 14 is greater than the inner diameter of the coupling member 13. Thus, the adhesion-preventing member 14 is arranged at a position between the inner wall surface of the evaporation source 10 and the inner wall surface of the coupling member 13. One end of a cylindrical electrode 50 is coupled to a second sealing member 16. The electrode 50 is composed of aluminum and is coupled to the second sealing member 16 with insulating sealing material (not shown) in between. The electrode 50 is grounded. The electrode 50 is arranged at a position closer to the central axis C than the coupling member 13.

Between the electrode 50 and the adhesion-preventing member 14, a gas passage 51 is provided that supplies gas from the space outside the evaporation source 10 to the internal space 10A of the evaporation source 10. Part of the gas passage 51 is constituted by an outer cylinder portion 52, which is coupled to the first end face 13A of the coupling member 13, and an inner cylinder portion 53, which is coupled to the second end face 13B of the coupling member 13. The outer cylinder portion 52 has a cylindrical shape, and its length in the axial direction is equal to the length in the axial direction of the adhesion-preventing member 14. The inner diameter of the outer cylinder portion 52 is equal to the inner diameter of the coupling member 13. The outer diameter of the outer cylinder portion 52 is smaller than the inner diameter of the adhesion-preventing member 14.

The inner cylinder portion 53 includes an annular contact portion 53A, which is in contact with the second end face 13B of the coupling member 13, and a cylindrical portion 53B, which is bent from a portion on the inner circumference of the contact portion 53A and extends in the axial direction. The second sealing member 15 is connected to the contact portion 53A. That is, the contact portion 53A is sandwiched between the second sealing member 16 and the coupling member 13, The second sealing member 16 and the contact portion 53A are coupled to each other with insulating sealing material (not shown) in between. The cylindrical portion 53B extends from the contact portion 53A toward the first sealing member 12, The outer diameter of the cylindrical portion 53B is smaller than the inner diameter of the coupling member 13. Thus, the cylindrical portion 53B is arranged to be separated from the coupling member 13 and is opposed to the outer cylinder portion 52. Further, the inner diameter of the cylindrical portion 53B is greater than the outer diameter of the electrode 50. The outer cylinder portion 52 is composed of, for example, stainless steel, and the inner cylinder portion 53 is composed of, for example, aluminum.

An introduction pipe 17 is coupled to the outer circumferential surface of the coupling member 13 and the outer circumferential surface of the inner cylinder portion 53, and communicates with an introduction groove 13C. The process gas flowing through the introduction pipe 17 flows into the space between the outer cylinder portion 52 and the inner cylinder portion 53 through the introduction groove 13C and is supplied to the internal space 10A of the evaporation source 10. That is, the gas passage 51 is constituted by the coupling member 13, the outer cylinder portion 52, and the inner cylinder portion 53. The gas passage 51 includes an introduction passage 51A and a communication passage 51B. The introduction passage 51A is constituted by the introduction groove 13C of the coupling member 13 and the contact portion 53A of the inner cylinder portion 53. The communication passage 51B is constituted by the inner wall surface of the coupling member 13 and the outer wall surface of the cylindrical portion 53B of the inner cylinder portion 53. The gas passage 51 also includes an outlet passage 51C, which is constituted by the outer cylinder portion 52 and the inner cylinder portion 53. The outlet passage 51C is an end portion of the gas passage 51 that is arranged in the internal space 10A of the evaporation source 10.

In this configuration, the end portion of the gas passage 51 is constituted by the outer cylinder portion 52 and the inner cylinder portion 53, which are composed of materials having different thermal expansion coefficients. Thus, in this configuration, aluminum, of which the inner cylinder portion 53 composed, corresponds to the first material, and stainless steel, of which the outer cylinder portion 52 is composed, corresponds to the second material. In the outlet passage 51C of the gas passage 51, the radially inner section, which is constituted by the inner cylinder portion 53, corresponds to the first section, and the radially outer section, which is constituted by the outer cylinder portion 52, corresponds to the second section. Since the inner cylinder portion 53 and the outer cylinder portion 52 are supported by the insulating sealing material and the coupling member 13, the cylinder portions 53, 52 are electrically insulated from the electrode 50 and the evaporation source 10.

This film forming apparatus applies discharge voltage to the evaporation source 10 from the external power supply 11, while supplying process gas through the gas passage 51, and applies bias voltage to the workpiece 100 using a bias supply 101. This generates arc discharge between the distal end of the electrode 50 and the evaporation source 10. As described above, the outer cylinder portion 52 and the inner cylinder portion 53 are composed of materials having different thermal expansion coefficients. Thus, when the inner cylinder portion 53 and the outer cylinder portion 52 are thermally expanded by receiving the heat of the arc discharge, the distance between the inner cylinder portion 53 and the outer cylinder portion 52 is shortened. In contrast, when the generation of arc discharge is stopped, the temperatures of the outer cylinder portion 52 and the inner cylinder portion 53 drop. Accordingly, the distance between the outer cylinder portion 52 and the inner cylinder portion 53 returns to the earlier distance that was present before the thermal expansion. Thus, even with this configuration, by repeatedly thermally expanding the outlet passage 51C of the gas passage 51 with the heat of the arc discharge generated during the film formation, the distance between the outer cylinder portion 52 and the inner cylinder port ion member 53 can be changed intermittently. Therefore, it is possible to achieve the same advantage as the above-described advantage (1). The first material, of which the inner cylinder portion 53 composed, and the second material, of which the outer cylinder portion 52 is composed, are not limited to stainless steel or aluminum, and metals such as copper, nickel, tungsten, molybdenum and the like can be employed when appropriate. In addition, if stainless steel is used as the first material, of which the inner cylinder portion 53 composed, and aluminum is used as the second material, of which the outer cylinder portion 52 is composed, the distance between the inner cylinder portion 53 and the outer cylinder portion 52 can be increased when the cylinder portions 53, 52 receive the heat of arc discharge and thermally expand.

In the above-described configuration, materials having different thermal expansion coefficients may be selected as the material of which the electrode 50 is composed and the material of which the inner cylinder portion 53 is composed. Also, materials having different thermal expansion coefficients may be selected as the material of which the adhesion-preventing member 14 is composed and the material of which the outer cylinder portion 52 is composed. Further, the adhesion-preventing member 14 may be omitted.

The end portions of the gas passages 18 and 51 do not necessarily correspond to the entire outlet passages 18C and 51C. For example, in the embodiment in which the outlet passage 18C is constituted by the above-described electrode 15 and adhesion-preventing member 14, the portion constituted by the distal end portion of the discharge portion 15B of the electrode 15 and the distal end portion of the adhesion-preventing member 14 may be referred to as the above-described end portion.

For example, the distal end portion of the discharge portion 15B in the electrode 15 may be composed of aluminum, and the remaining portion of the electrode 15 may be composed of stainless steel, in this configuration, since the entire adhesion-preventing member 14 including the distal end portion is composed of stainless steel, the distal end portion of the electrode 15 and the distal end portion of the adhesion-preventing member 14, which are opposed to each other, are constituted by materials of different thermal expansion coefficients. The remaining parts of the electrode 15 and the adhesion-preventing member 14 are composed of the same material.

Alternatively, the entire electrode 15 may be composed of aluminum, the distal end portion of the adhesion-preventing member 14 may be composed of stainless steel, and the remaining portions of the adhesion-preventing member 14 may be composed of aluminum. In this case, the portion constituted by the distal end portion of the electrode 15 and the distal end portion of the adhesion-preventing member 14 can be the end portion arranged in the internal space 10A of the evaporation source 10 in the gas passage 18.

The distal end portion of the electrode 15 constitutes the first section, and the distal end portion of the adhesion-preventing member 14 constitutes the second section. Even with such a configuration, it is possible to change the distance between the first section and the second section in the gas passage 15 by using the heat of arc discharge, and the metal film M adhered to the end portion of the gas passage 18 can be shed.

The configuration of the gas passage is not limited to that described above. For example, the configurations shown in FIGS. 6A and 6B can be employed.

Figure 6A:
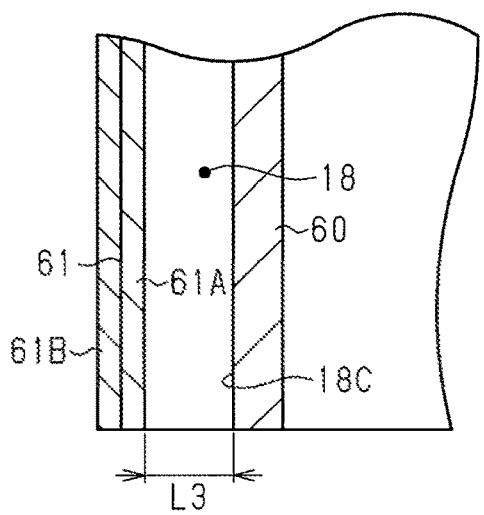
FIG. 6A is a cross-sectional view showing an end portion of a gas passage before thermal expansion due to arc discharge in a film forming apparatus according to another modification.
Figure 6B:
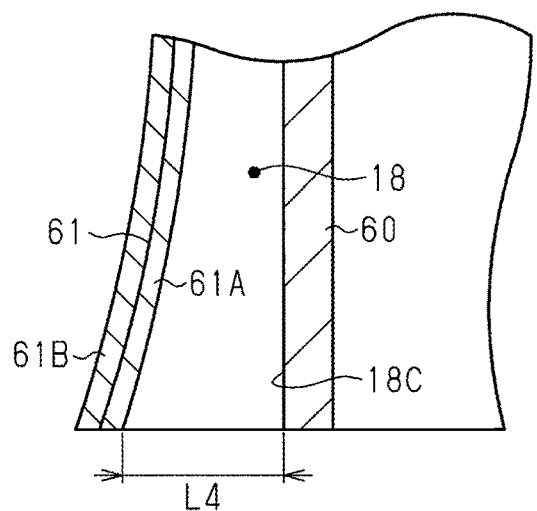
FIG. 6B is a cross-sectional view showing a manner in which the end portion of the gas passage is deformed after thermal expansion due to arc discharge in the film forming apparatus according to the modification of FIG. 6A.

As shown in FIG. 6A, the outlet passage 18C, which constitutes the end portion of the gas passage 18, may be constituted by a cylindrical first member 60 and a cylindrical second member 61, which has an inner diameter greater than the outer diameter of the first member 60. The second member 61 is a bimetallic object that is constituted by an inner circumferential portion 61A opposed to the first member 60 and an outer circumferential portion 61B coupled to the outer circumferential surface of the inner circumferential portion 61A. The inner circumferential portion 61A is composed of a material having a thermal expansion coefficient higher than that of the outer circumferential portion 61B. The outer circumferential portion 61B is composed of a material having a thermal expansion coefficient higher than that of the first member 60. That is, the materials of which the second member 61 is composed are both materials having thermal expansion coefficients higher than that of the first member 60. In the outlet passage 18C of the gas passage 18, the radially inner section, which is constituted by the first member 60, corresponds to the first section, and the radially outer section, which is .constituted by the second member 61, corresponds to the second section.

In this configuration, the degree of radially outward expansion of the first member 60 is smaller than the degree of radially outward expansion of the second member 61. Thus, when the first member 60 and the second member 61 are thermally expanded by the heat of arc discharge, the distance L4 between the first member 60 and the second member 61 after the thermal expansion is longer than the distance L3 between the first member 60 and the second member 61 before thermal expansion as shown in FIG. 68. Since the second member 61 is a bimetallic object, and the inner circumferential portion 61A has a higher thermal expansion coefficient than the outer circumferential portion 61B, the distal end portion of the second member 61 is bent away from the first member 60. According to such a configuration, it is possible to change the distance between the first member 60 and the second member 61 more greatly before and after the thermal expansion. Therefore, it is possible to achieve the same advantage as the above-described advantage (1), The relationship between the thermal expansion coefficients of the material of which the first member 60 is composed and the materials of which the second member 61 is composed is not limited to the one described above. For example, the thermal expansion coefficient of the material of which first member 60 is composed may be higher than chose of the materials of which the second member 61 is composed. In the second member 61, the inner circumferential portion 61A may be composed of a material having a thermal expansion coefficient lower than that of the outer circumferential portion 61B. Further, the thermal expansion coefficient of the material of which the first member 60 is composed may be lower than that of one of the materials of which the second member 61 is composed and higher than that of the other. In short, it is only necessary for the first member 60 and the second member 61, which constitute the outlet passage 18C of the gas passage 18, to be composed of materials having different thermal expansion coefficients.

Further, the first member 60 may be a bimetallic object as described above.

The evaporation source 10 does not necessary need to be cylindrical. For example, the evaporation source 10 may have a tubular shape with a polygonal cross section. Further, the evaporation source 10 may have a tubular shape with a closed end. In this case, the first sealing member 12 can be omitted.

The configuration of the coupling member 13 is not limited to that of the above embodiment. For example, a plurality of introduction grooves 13C may be provided in the circumferential direction. In this case, multiple introduction pipes 17 are provided to correspond to the multiple introduction grooves 13C. Further, the configuration of the introduction passages 18A, 51A of the gas passages 18, 51 is not limited to the introduction groove 13C. For example, the introduction groove 13C may be replaced by a through-hole extending through the coupling member 13, instead of providing the introduction groove 13C in the coupling member 13, supporting members such as supporting columns extending from the surface facing the coupling member 13 to the coupling member 13 may be provided on the contact plate portion 15A of the electrode 15 and the contact portion 53A of the inner cylinder portion 53. With this configuration, the support columns maintain the clearance between the coupling member 13 and the electrode 15 or the inner cylinder portion 53, providing the introduction passages 18A, 51A of the gas passages 18, 51.

In the method for manufacturing the coupling member 13 according to the above-illustrated embodiment, the coupling member 13 is molded with a conductive material, and then, the surface of the coupling member 13 is covered with an insulating material. However, the coupling member 13 may be manufactured through another method. For example, it is also possible to manufacture an insulating coupling member 13 by molding an insulating material into a desired shape.

The above-described film forming apparatus may be provided with a striker. The striker is grounded and can be displaced between a position in contact with the evaporation source 10 and a retracted position in which it does not contact the evaporation source 10. In this configuration, discharge voltage is applied to the evaporation source 10 from the external power supply 11, and bias voltage is applied to the workpiece 100 by the bias supply 101. Then, the striker is brought into contact with the evaporation source 10 and separated from the evaporation source 10 immediately thereafter; arc discharge is generated in which the evaporation source 10 serves as a cathode and the electrode 15 serves as an anode.

At the above-described end portions of the gas passages 18, 51, the thickness of one of the first section and the second section that is composed of a material having the higher thermal expansion coefficient may be made thinner than the other. With this configuration, the amount of deformation of the thinner one of the first and second sections can be set greater than that of the other in relation to the amount of heat transferred from the arc discharge. This allows, the distance between the first and second sections to be changed greatly.

The adhesion-preventing member 14, the discharge portion 15B of the electrode 15, the outer cylinder portion 52, and the cylindrical portion 53B of the inner cylinder portion 53 are formed in a cylindrical shape, but these shapes may be changed as necessary. That is, in the cross section in the direction orthogonal to the axial direction, each of the above members is not limited to have an annular shape, but may have, for example, an arcuate shape. Such a configuration causes the gas passages 18, 51 to be formed in arcuate shapes in the cross section. As described above, the gas passages 18, 51 are not limited to be annular in the cross section. Even with such a configuration, the end portions of the gas passages 18, 51 have the first section and the second section composed of materials having different thermal expansion coefficients. Thus, by using the heat of arc discharge, it is possible to change the distance between the first section and the second section in the radial direction and the axial direction.

The invention claimed is:

1. A film forming apparatus comprising:
    a cylindrical evaporation source that is composed of metal and includes an internal space for accommodating a workpiece;
    an electrode arranged in the internal space of the evaporation source; and
    a gas passage that supplies gas to the internal space of the evaporation source from a space outside the evaporation source and includes an end portion located in the internal space, wherein
    the film forming apparatus is configured to form a film by depositing, on the workpiece, metal ions are released from the evaporation source by arc discharge generated between the evaporation source and the electrode,
    the end portion of the gas passage includes
        a first section composed of a first material, and
        a second section composed of a second material, and
    the first material and the second material have different thermal expansion coefficients.

2. The film forming apparatus according to claim 1, further comprising an adhesion-preventing member that is arranged between the evaporation source and the electrode and is electrically insulated from the evaporation source and the electrode, wherein
    the electrode includes the first section,
    the adhesion-preventing member includes the second section, and
    the end portion of the gas passage is constituted by the electrode and the adhesion-preventing member.

3. The film forming apparatus according to claim 2, wherein the first material, of which the electrode is composed, has a higher thermal conduction coefficient than that of the second material, of which the adhesion-preventing member is composed.

4. The film forming apparatus according to claim 2, wherein the first material, of which the electrode is composed, has a lower thermal expansion coefficient than that of the second material, of which the adhesion-preventing member is composed.

5. The film forming apparatus according to claim 1, wherein the first material, of which the electrode is composed, has a lower thermal expansion coefficient than that of the second material, of which the adhesion-preventing member is composed.

* * * * *